(12) United States Patent
Llewellyn

(10) Patent No.: US 6,329,876 B1
(45) Date of Patent: Dec. 11, 2001

(54) NOISE REDUCTION SCHEME FOR OPERATIONAL AMPLIFIERS

(75) Inventor: William D. Llewellyn, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/406,319

(22) Filed: Sep. 27, 1999

Related U.S. Application Data

(60) Provisional application No. 60/114,706, filed on Jan. 4, 1999, and provisional application No. 60/146,429, filed on Jul. 29, 1999.

(51) Int. Cl.$^7$ .................................................. H03F 3/45
(52) U.S. Cl. ............................................ 330/69; 330/9
(58) Field of Search ............................. 330/69, 9, 301

(56) References Cited

U.S. PATENT DOCUMENTS

| | | | | |
|---|---|---|---|---|
| 3,566,298 | * | 2/1971 | Stevens ................................... | 330/84 |
| 4,888,559 | * | 12/1989 | Sevenhans et al. ................... | 330/253 |
| 5,140,591 | * | 8/1992 | Palara et al. .......................... | 307/270 |
| 5,376,899 | * | 12/1994 | Pass ....................................... | 330/69 |
| 5,606,281 | * | 2/1997 | Gloaguen ............................... | 330/51 |
| 5,736,826 | * | 4/1998 | Hrassky ................................. | 330/257 |
| 5,841,318 | * | 11/1998 | Cram ..................................... | 330/69 |
| 5,841,321 | * | 11/1998 | Miyake et al. ........................ | 330/255 |
| 5,990,737 | * | 11/1999 | Czarnul et al. ........................ | 330/69 |
| 6,163,212 | * | 12/2000 | Konno .................................. | 330/133 |

* cited by examiner

*Primary Examiner*—Robert Pascal
*Assistant Examiner*—Khanh Van Nguyen
(74) *Attorney, Agent, or Firm*—Beyer Weaver & Thomas LLP

(57) ABSTRACT

Methods and apparatus are described for generating or amplifying a differential signal. The output of a first op amp corresponds to one end of the differential signal. The output of a second op amp corresponds to the other end of the differential signal. The inverting input of the first op amp is coupled to the noninverting input of the second op amp.

17 Claims, 10 Drawing Sheets

FIG. 5E

Layout Notes:

R307 & R331 are each made up of two 6.75K 0.7um segments which comprise the volume_coarse3 ladder. Dummies are needed for proper matching. Metal option initially shorted (E).

\*............indicates adjacent

\*............indicates cross-couple

\* SN = 0.5, SP = 0.55, Rfb = 20K

Design Notes:

For THD runs,
0 - 0.2ms with Fin=1/(8192*10n)

Options, SpectreS:
reltol = 1e-7
vabstol = 1e-7
iabstol = 1e-13

Options, transient:
method = gear2only
errpreset = conservative
maxstep = 10n
skipstart = 0
skipstop = 80e-6
strobeperiod = 10n For THD measurement in Calculator:

F(input) = 1/(8192*10n)
=12.207kHz
THD from 118.08e-6 to 200e-6 wih 8192 points (also use dB20)

fets can cause significant distortion due to non-linear source-drain capacitances if sources and/or drains are allowed to see voltage swing. Should be kept at ground or virtual ground.

Driving volume_coarse3 ladder with low impedence instead of current sources results in noise gain increase of 1.15dB.

1st amp, slow models, T=150 A(OL)=92dB; f(0dB)=7.28MHz

In digital mode, 0dB to -5.5dB steps will be done in 1-bit DAC; In analog input mode, 0dB to -5.5dB steps will be done in input buffering opamp feedback resistors.

| atten  | Rf equiv | R/element |
|--------|----------|-----------|
| 0dB    | R        | inf       |
| -.5dB  | 0.9440R  | 16.87R    |
| -1dB   | 0.8912R  | 8.196R    |
| -1.5dB | 0.8414R  | 5.305R    |
| -2dB   | 0.7943R  | 3.862R    |
| -2.5dB | 0.7499R  | 2.998R    |
| -3dB   | 0.7079R  | 2.424R    |
| -3.5dB | 0.6683R  | 2.015R    |
| -4dB   | 0.6310R  | 1.710R    |
| -4.5dB | 0.5957R  | 1.473R    |
| -5dB   | 0.5634R  | 1.285R    |
| -5.5dB | 0.5309R  | 1.132R    |

NOISE REDUCTION SCHEME FOR
OPERATIONAL AMPLIFIERS

RELATED APPLICATION DATA

The present application claims priority from U.S. Provisional Patent Application No. 60/114,706 for NOISE REDUCTION SCHEME FOR A SINGLE-ENDED TO DIFFERENTIAL CONVERTER filed on Jan. 4, 1999, and U.S. Provisional Patent Application No. 60/146,429 for NOISE REDUCTION SCHEME FOR OPERATIONAL AMPLIFIERS filed on Jul. 29, 1999, the entirety of each of these provisional applications being incorporated herein by reference for all purposes.

BACKGROUND OF THE INVENTION

The present invention relates to the use of operational amplifiers (op amps) in differential signal architectures. More specifically, the present invention provides techniques by which the performance of op amps which generate differential signals may be enhanced.

In analog integrated circuits, electrical signals are often processed in differential form, i.e., each signal has a paired counterpart of equal amplitude and opposite phase. Differential architectures are employed for a number of reasons including, for example, the fact that differential architectures exhibit significantly better power supply noise rejection than single-ended designs. Op amps are among the most common circuit components in differential systems. FIG. 1 shows an op amp circuit which is commonly employed in differential designs.

FIG. 1 shows a circuit 100 for converting an incoming single-ended signal Vin to a differential signal represented by V+ and V−. Such circuits are common where, for example, an integrated circuit with a differential architecture is embedded in a larger system where it must interface with single-ended signals. The conversion from a single-ended to a differential signal involves using a first op amp 1 as an input buffer and a second op amp 2 to create a phase-inverted counterpart of Vin. Both the original in-phase signal (V−) and the phase-inverted version (V+) are then fed to subsequent differential circuitry (e.g., op amp 3). The buffering provided by op amp 1 provides a low impedance signal to subsequent circuits. While this is desirable, it does not come without a cost. That is, the addition of a stage of amplification adds noise, distortion, offset, and possibly other undesirable effects.

As shown in FIG. 1 with reference to op amp 1 and assumed for the op amps in each of the figures described herein, the noise voltage associated with each op amp is modeled as an input referred noise voltage source Vn. The input-referred noise sources for specific op amps will be identified by a reference number subscript. That is, the noise source for op amp 1 is denoted $Vn_1$. The noise values are given in squared noise voltage, e.g., $Vn_1^2$. As will be understood and assuming the noise sources are uncorrelated, a weighted sum of these noise voltages is calculated as the square root of the sum of the squares. As will also be understood, the input gain is set by the ratio of resistor value R2 to resistor value R1. Resistor values for R3 and R4 are equal in value to ensure that V+ is equal in amplitude to V− as well as being opposite in phase. Op amp 3 and resistors R5–R8 are shown as representative of differential circuitry which might follow the single-ended to differential conversion, but will not be further discussed here. The key parameter of interest is the noise voltage presented to the equivalent input of the differential circuitry, i.e., Vdiff= (V+)−(V−). The expression for the noise voltage at V− is:

$$Vn^2(V-) = Vn_1^2(1+R2/R1) \tag{1}$$

The expression for the noise voltage at V+ is:

$$Vn^2(V+) = Vn_2^2(1+R4/R3) - Vn_1^2(1+R2/R1)(R4/R3) \tag{2}$$

Since R3=R4:

$$Vn^2(V+) = 2Vn_2^2 - Vn_1^2(1+R2/R1) \tag{3}$$

Then the noise presented at the input to op amp 3 may be represented as follows:

$$Vndiff^2 = Vn^2(V+) - Vn^2(V-) \tag{4}$$

$$= 2Vn_2^2 - Vn_1^2(1+R2/R1) - Vn_1^2(1+R2/R1) \tag{5}$$

$$= 2Vn_2^2 - 2Vn_1^2(1+R2/R1) \tag{6}$$

It can be seen that the noise voltage of the input buffering amplifier, $Vn_1^2$, is amplified by the non-inverting gain configuration of op amp 1, and applied to the V− input of the differential circuitry. This same amplifier noise voltage is also phase-inverted an applied to the V+ input of the differential circuitry. Thus, $Vn_1^2$ is effectively amplified by both op amp 1 and op amp 2. This then calls for a particularly low-noise op amp in the op amp 1 position in order to minimize its noise contribution. As will be understood, low-noise op amps are expensive both in terms of money and silicon.

It is therefore desirable to provide techniques by which the noise performance of op amps in differential architectures may be improved.

SUMMARY OF THE INVENTION

According to the present invention, a technique is provided by which the performance of operational amplifiers (op amps) in differential architectures is significantly improved. According to the various embodiments described, first and second op amps are configured to generate a differential signal, the first op amp generating one end of the differential signal and the second op amp generating the other. The op amps may be configured to receive a single-ended signal and convert it to a differential signal. Depending upon the single-ended to differential application, the op amps may be configured in either an inverting or noninverting configuration. The op amps may also be configured in a "pseudo" differential arrangement in which each receives half of a differential signal and buffers and/or amplifies it to generate a differential output signal. In each configuration, the inverting input of one of the op amps is coupled to the noninverting input of the other. That is, instead of biasing the noninverting input of the second op amp to ground or a constant bias voltage, it is tied to the signal input of its companion device. According to a specific embodiment, a number of switches are provided which effect the various configurations of the two op amps depending upon the application.

As will be described in detail below, the effect of this configuration is that a significant component of the input referred noise of the first op amp is presented as a common mode signal on the differential output, this component thus being eliminated by downstream devices, e.g., other op amps, which presumably have excellent common mode rejection. In fact, noise improvement is not the only advantage gained by the present invention. That is, as will be discussed, the deleterious effects of any anomalous op amp behavior which may be modeled as an input referred voltage source, e.g., distortion, is likewise diminished by the technique described herein.

Thus, the present invention provides methods and apparatus for generating a differential signal. The output of a first operational amplifier corresponds to one end of the differential signal. The output of a second operational amplifier corresponds to the other end of the differential signal. The inverting input of the first operational amplifier is coupled to the noninverting input of the second operational amplifier.

A further understanding of the nature and advantages of the present invention may be realized by reference to the remaining portions of the specification and the drawings.

BRIEF DESCRIPTION OF THE DRAWINGS

FIGS. 5 and 5A–E show portions of a detailed schematic of yet another specific embodiment of the present invention.

DETAILED DESCRIPTION OF SPECIFIC EMBODIMENTS

Figure 1:
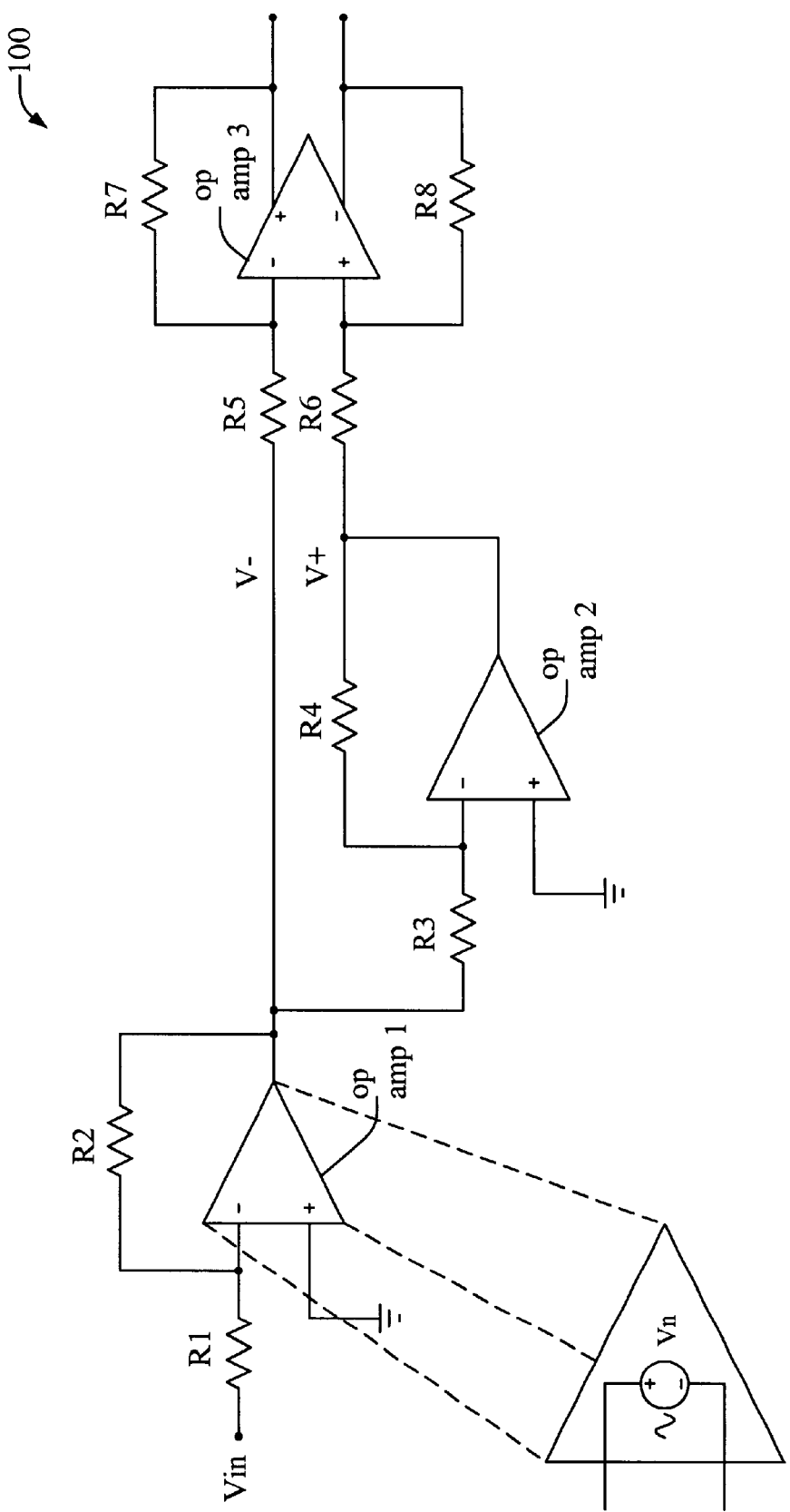
FIG. 1 is a simplified schematic of circuit for converting a single-ended signal into a differential signal.
Figure 2:
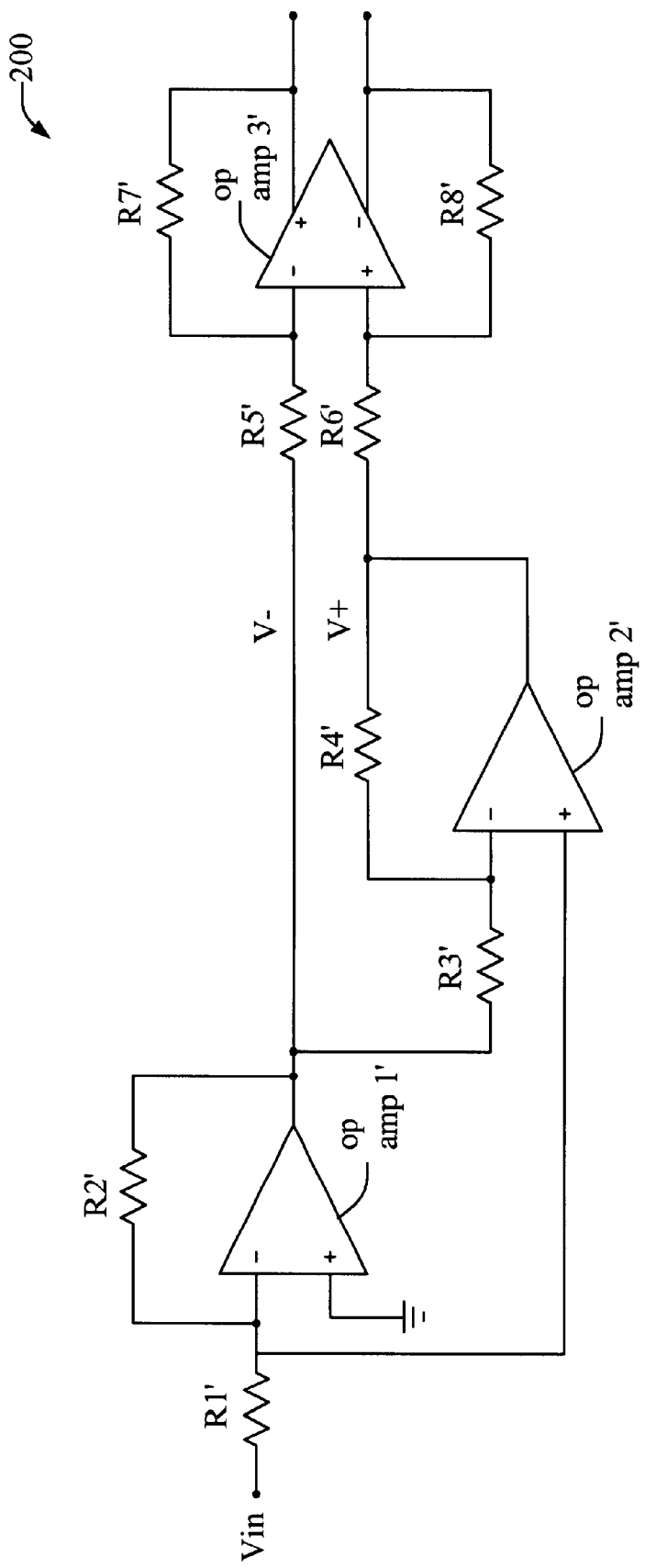
FIG. 2 is a simplified schematic of a specific embodiment of the present invention.

FIG. 2 is a simplified schematic of a circuit 200 for converting a single-ended signal to a differential signal designed according to a specific embodiment of the present invention. Instead of grounding the noninverting input of op amp 2' as shown in FIG. 1, the noninverting input of op amp 2' is instead connected to the inverting input of op amp 1'.

Calculating the circuit noise for this configuration, we have:

$$Vn^2(V-) = Vn_{1'}^2(1+R2'/R1')  \quad (7)$$

As can be seen this term remains unchanged from the circuit shown in FIG. 1 (see equation (1). However, $$Vn^2(V+) = Vn_{2'}^2(1+R4'/R3') - Vn_{1'}^2(1+R2'/R1')(R4'/R3') + Vn_{1'}^2(1+R4'/R3') \quad (8)$$

and because R3=R4:

$$Vn^2(V+) = 2Vn_{2'}^2 - Vn_{1'}^2(1 + R2'/R1') + 2Vn_{1'}^2 \quad (9)$$

$$Vndiff^2 = Vn^2(V+) - Vn^2(V-) \quad (10)$$

$$= 2Vn_{2'}^2 - Vn_{1'}^2(1 + R2'/R1') + 2Vn_{1'}^2 - Vn_{1'}^2(1 + R2'/R1') \quad (11)$$

$$= 2Vn_{2'}^2 - 2Vn_{1'}^2(1 + R2'/R1') + 2Vn_{1'}^2 \quad (12)$$

$$= 2Vn_{2'}^2 - 2Vn_{1'}^2(R2'/R1') \quad (13)$$

As can be seen, Vndiff² for circuit 200 is less than Vndiff² for circuit 100 by one 2 $Vn_{1'}^2$ term. Moreover, as the ratio of R2'/R1' becomes small, the remainder of the noise contribution due to $Vn_{1'}$, i.e., the input referred noise of the op amp 1', also becomes small and, in fact, depending on the system, can become negligible with respect to the contributions of $Vn_{2'}$. For example, if Vin were driven by a conventional +15 V/−15 V audio op amp design and the circuitry of FIG. 2 was +5 V circuitry, the R2'/R1' ratio would need to be small to bring the large 30 Vpp signal within the 5 Vpp constraints. In such a system, R2'/R1' would approximately equal 1/6 and the residual noise contribution of op amp 1' would be quite small.

A further advantage of this configuration can be seen when the input-referred noise voltage source $Vn_{1'}$ is replaced by any other anomalous behavior which could be modeled as an input-referred voltage source such as, for example, offset or distortion. With such a substitution, the above analysis would still hold true, and the deleterious effects of these other anomalies in op amp 1' would be likewise diminished. This could be used to substantial advantage by the circuit designer in that the noise, distortion, offset, etc., requirements of op amp 1' could be relaxed with the use of this invention, allowing for the substitution of a smaller, cheaper, lower power op amp without compromising overall system performance. Alternatively, the invention could be used with no relaxation in the performance requirements on op amp 1' in order to enhance overall system performance essentially for free.

Figure 3:
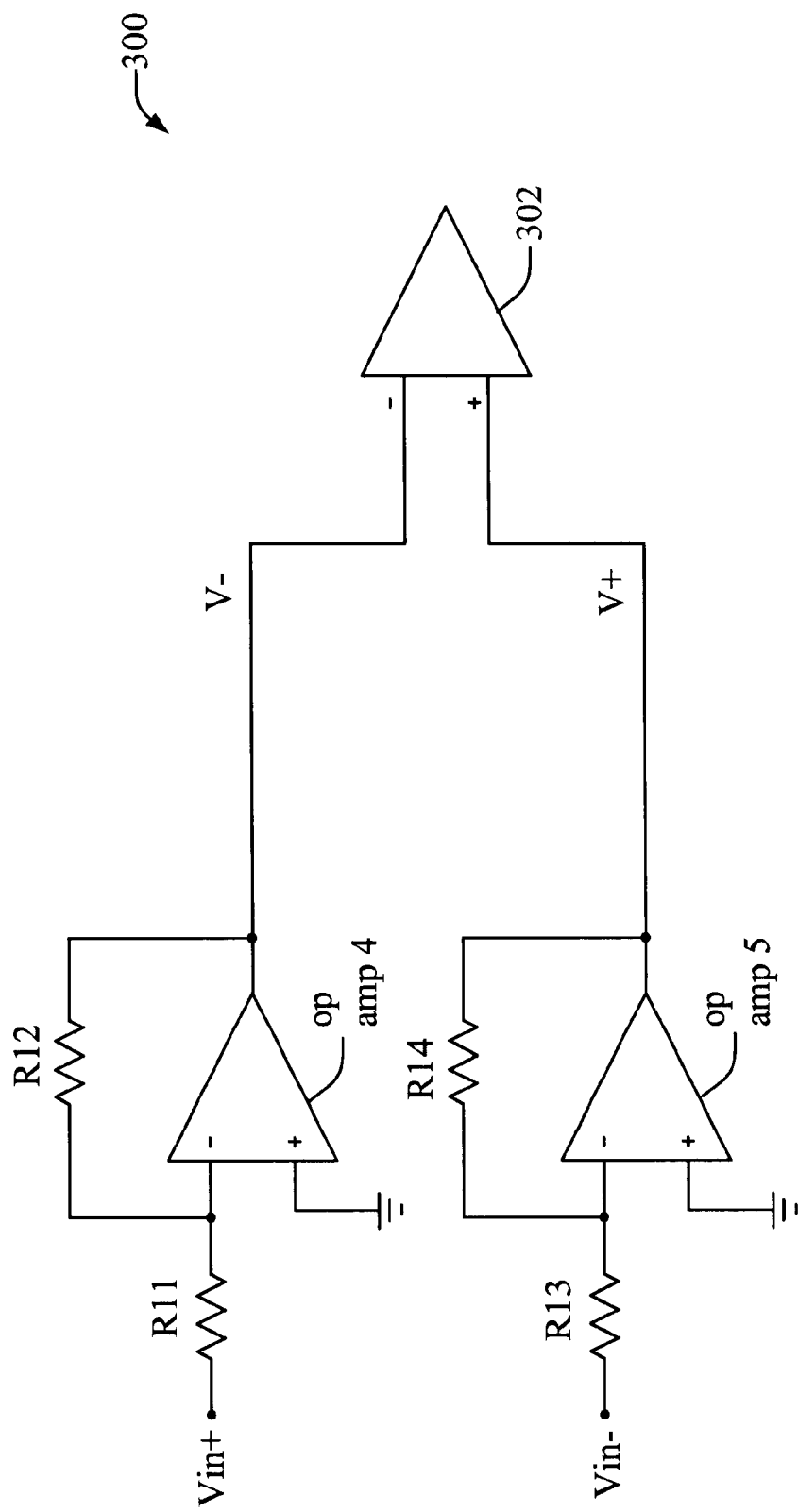
FIG. 3 is a simplified schematic of a circuit for buffering and/or amplifying a differential signal.

Another embodiment of the present invention will now be described with reference to FIGS. 3 and 4. FIG. 3 shows a circuit 300 for buffering and/or amplifying an existing differential signal represented by Vin+ and Vin−. The input signal passes through two separate amplifiers, op amp 4 and op amp 5, which are configured to have gains of −R12/R11 and −R14/R13, respectively. Their outputs together constitute the amplified differential signal which is passed to a generic differential amplifier block 202 representing any generalized differential receiving circuitry.

In this case, the noise contributions of the two amplifiers, op amps 4 and 5, are:

$$Vn^2(V-) = Vn_4^2(1+R12/R11) \quad (14)$$

$$Vn^2(V+) = Vn_5^2(1+R14/R13) \quad (15)$$

$$Vndiff^2 = Vn^2(V+) - Vn^2(V-) = Vn_5^2(1+R14/R13) - Vn_4^2(1+R12/R11) \quad (16)$$

As with circuit 100 of FIG. 1, there are significant noise contributions from both op amps 4 and 5.

Figure 4:
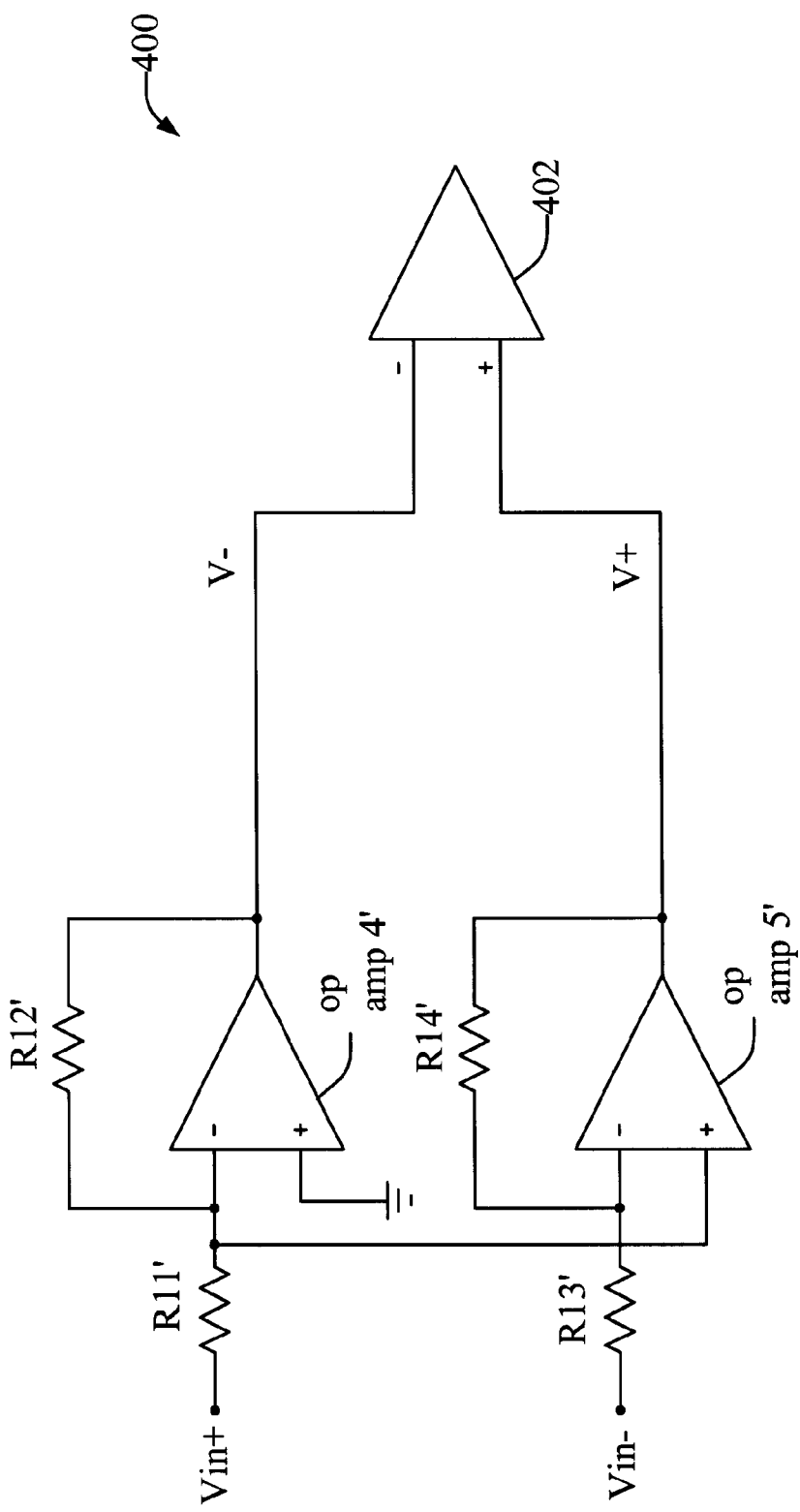
FIG. 4 is a simplified schematic of another specific embodiment of the present invention.
Figures 5, 5A, 5B, 5C, 5D:
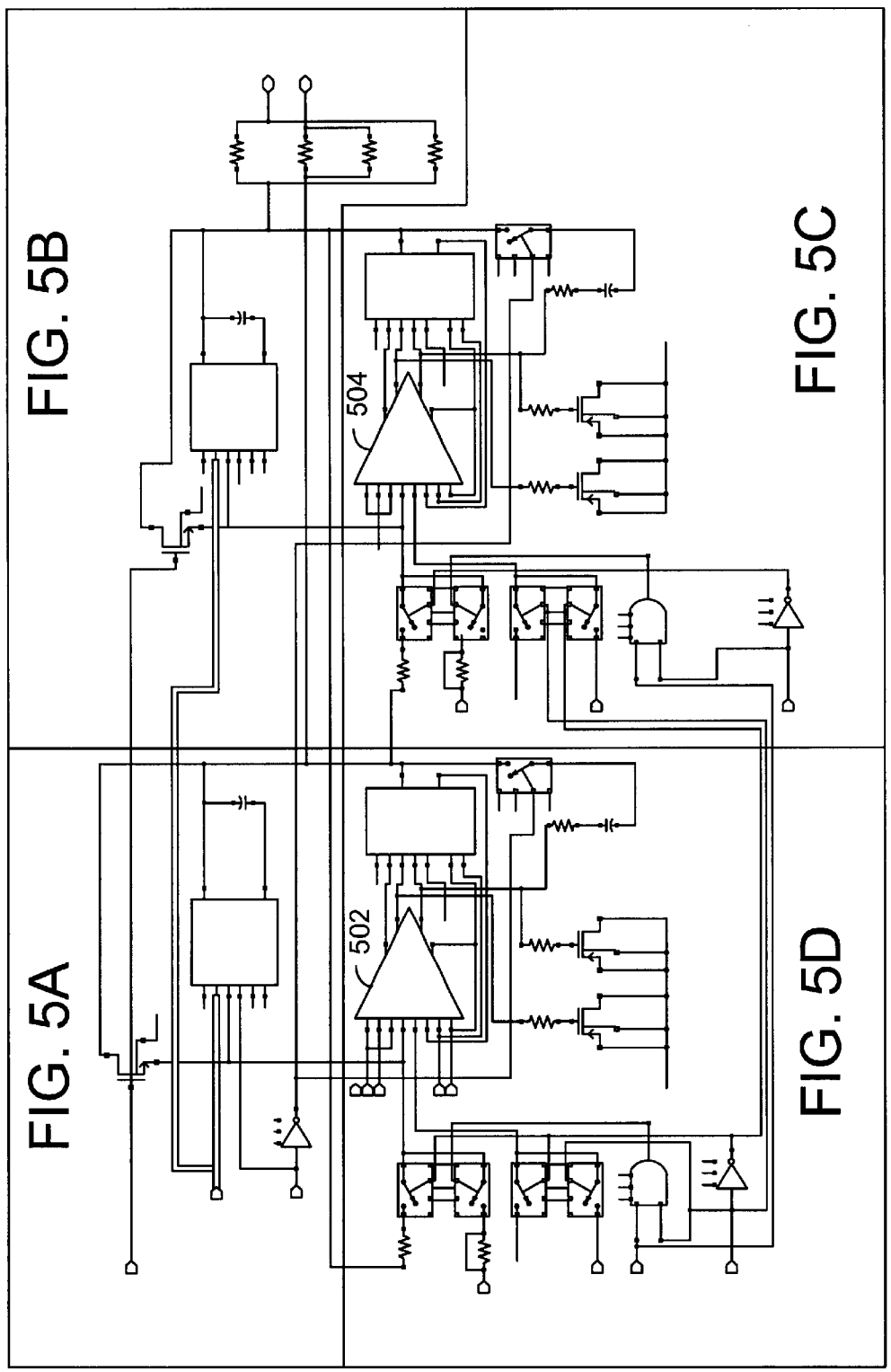
Figure 5A:
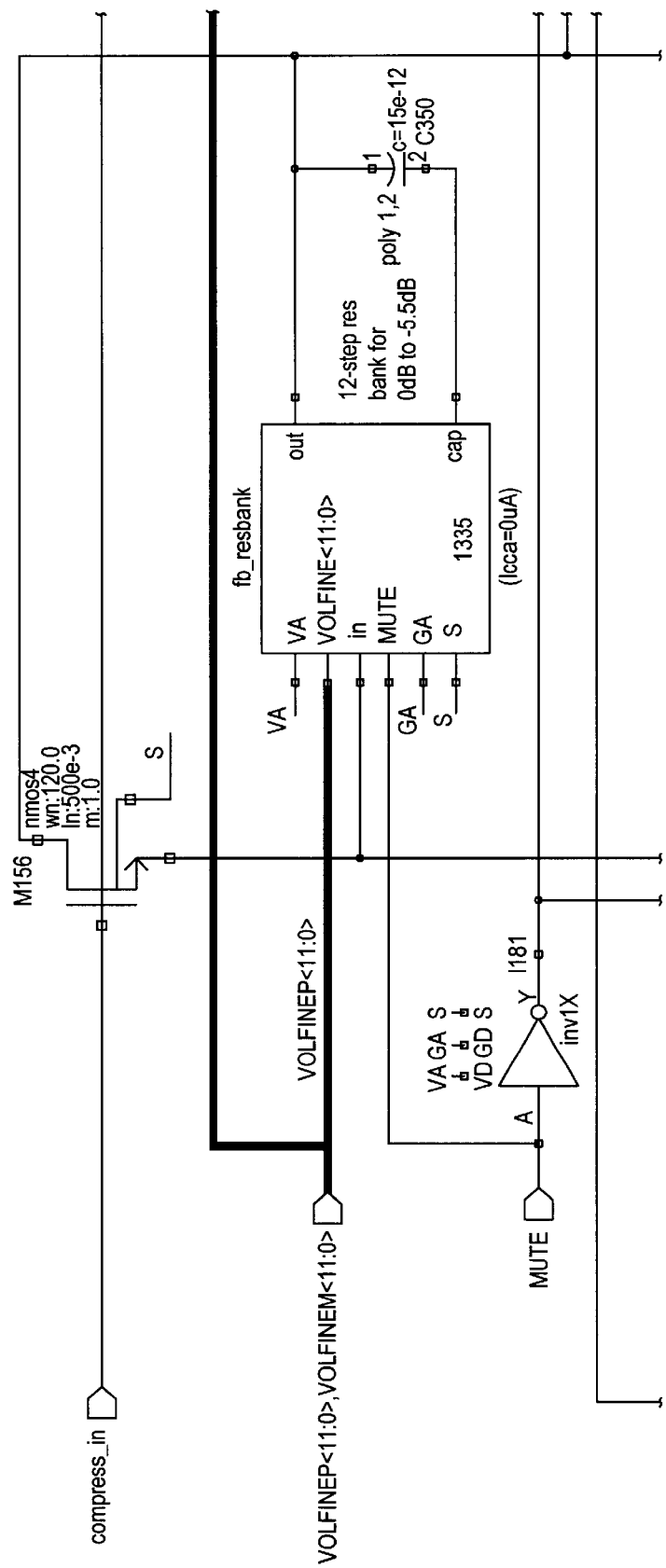
Figure 5B:
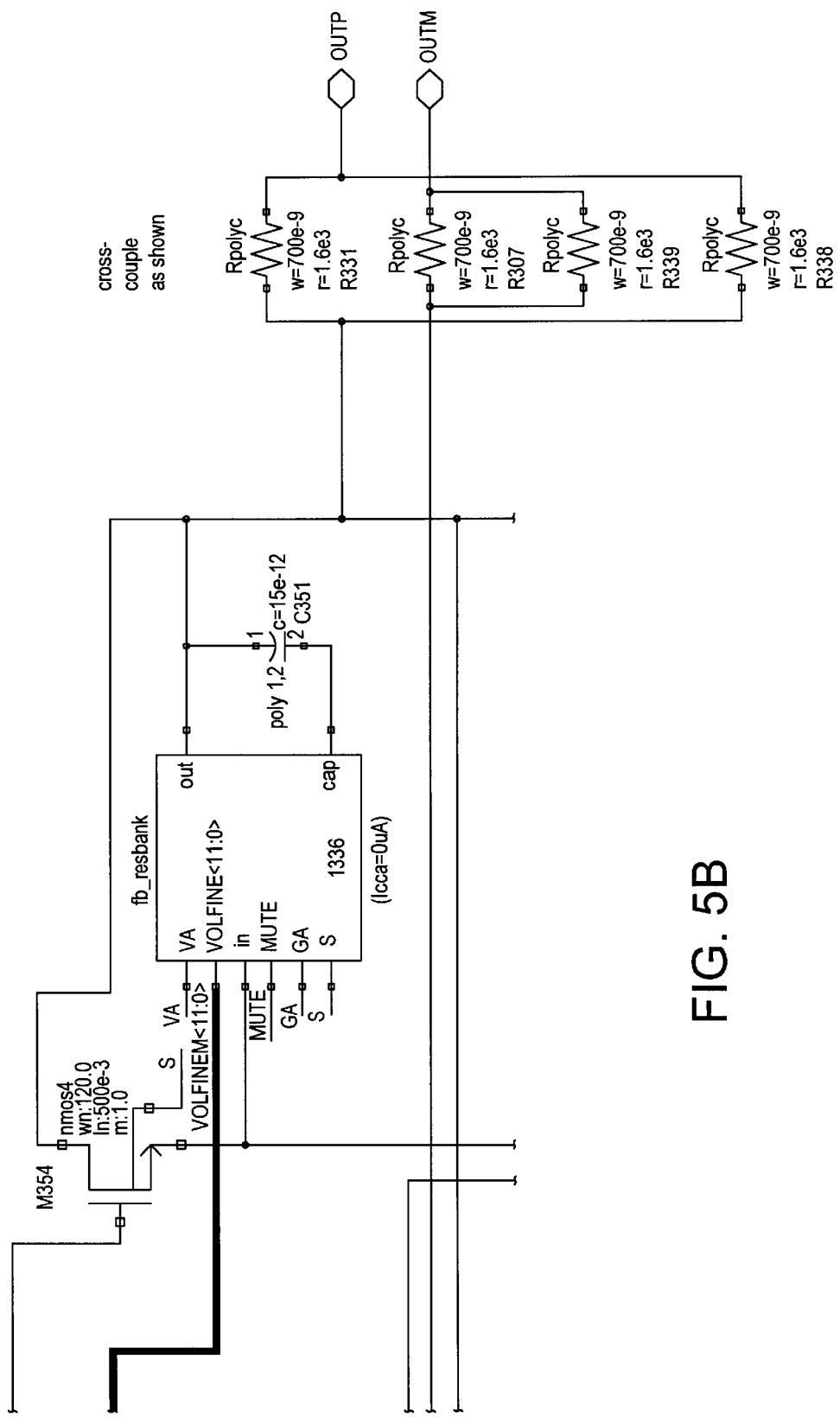
Figure 5C:
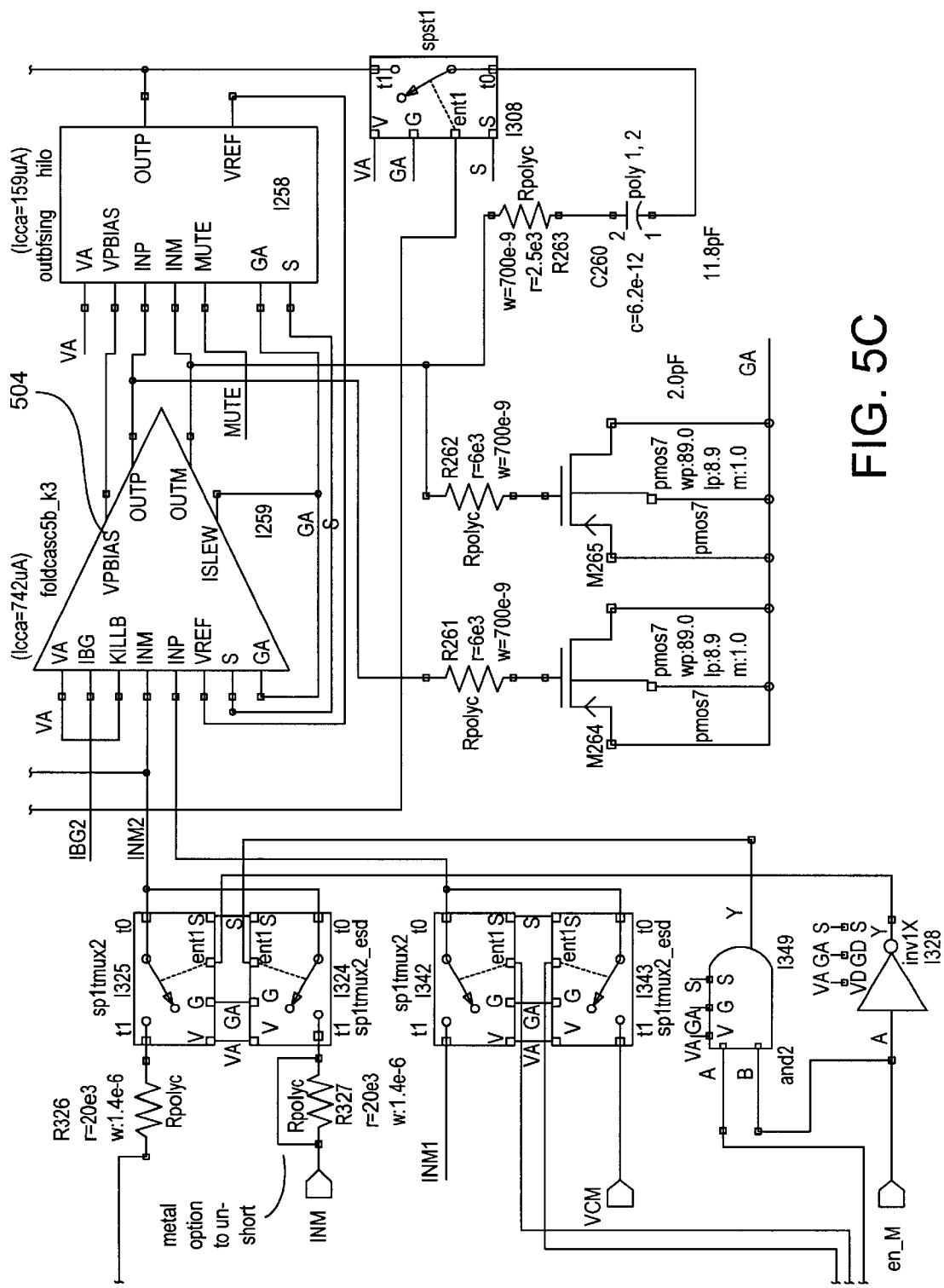
Figure 5D:
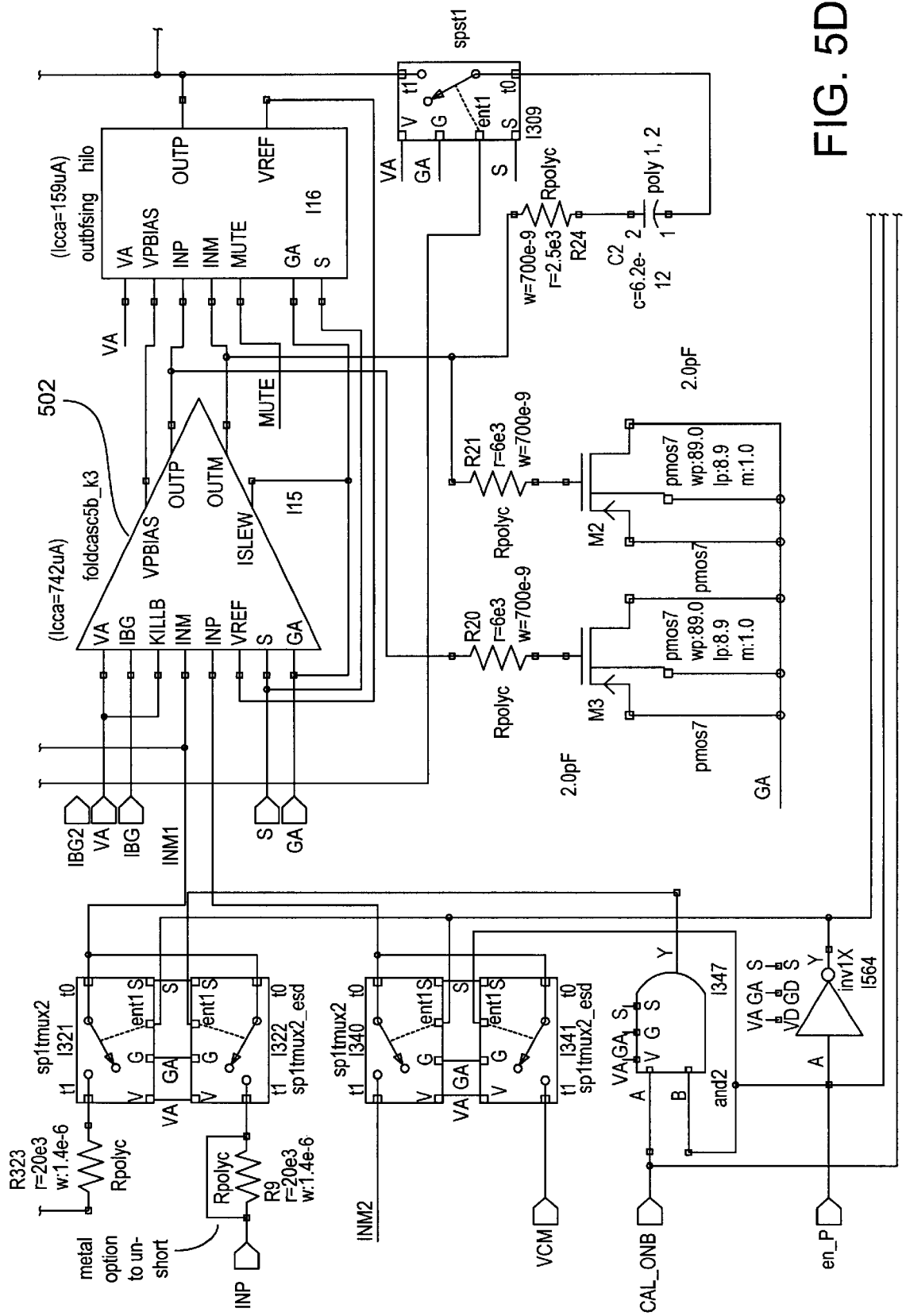

FIG. 4 is a simplified schematic of a circuit 400 for buffering and/or amplifying an existing differential signal according to another specific embodiment of the present invention. Instead of connecting the noninverting input terminal of op amp 5' to ground as shown in FIG. 3, it is instead connected to the inverting input of op amp 4'. The noise summary for the configuration of FIG. 4 is as follows:

$$Vn^2(V-) = Vn_4^2(1+R12'/R11') \quad (17)$$

As can be seen this term remains unchanged from the circuit shown in FIG. 3 (see equation (14). However, $$Vn^2(V+) = Vn_{5'}^2(1 + R14'/R13') + Vn_{4'}^2(1 + R13'/R14') \quad (18)$$

$$Vndiff^2 = Vn^2(V+) - Vn^2(V-) \quad (19)$$
$$= Vn_{5'}^2(1 + R14'/R13') +$$
$$Vn_{4'}^2(1 + R13'/R14') - Vn_{4'}^2(1 + R12'/R11')$$

For true differential symmetry, R14'/R13'=R12'/R11', and thus:

$$Vndiff^2 = Vn^2(V+) - Vn^2(V-) = Vn_{5'}^2(1+R14'/R13') \quad (20)$$

It can be seen that the reconfiguration has caused the noise contribution of op amp 4' to vanish. If $Vn_4^2$ and $Vn_5^2$ are uncorrelated, this constitutes a 3 dB reduction in noise contribution from this (pseudo) differential amplification stage. Additionally, as in the case above with the single-ended to differential conversion circuitry, any non-ideality in Opamp1 which can be modeled as an input-referred voltage source will likewise vanish.

FIGS. 5 and 5A–5E show portions of a detailed schematic of yet another specific embodiment of the present invention. Circuit 500 employs left hand and right hand op amps 502 and 504 which may be configured such that circuit 500 operates in three modes. The three modes are: (1) pseudo-differential amplification; (2) non-inverting single-ended to differential conversion; and (3) inverting single-ended to differential conversion.

In normal operation, the MUTE input port is at a logic-0 and the CAL_ONB input port is at a logic-1. The "compress_in" input port is not material to the invention and should be assumed to be at 0 V. The circuit elements designated "sp1tmux2_esd" are cmos transmission gates. Their V, G, and S terminals can be ignored for small signal analysis purposes, and their "ent1" input causes conduction between ports "t1" and "t0" when at a logic-1 and opens the path between ports "t1" and "t0" when at a logic-0. VCM is a common mode bias voltage, in this case 2.4 V. INP is the non-inverting input of each op amp, INM is the inverting input of each op amp, and OUTP is the output terminal of each op amp. All other terminals on the op amps can be ignored for small signal analysis. Both op amps are shown as having two sections, though this is not material to this invention. The circuit elements designated "fb_resbank" are banks of 12 feedback resistors which range from 10.62 k to 20 k with values selected to yield gain control in 0.5 dB steps. The particular feedback resistor configuration used here is not critical to the invention, though, according to a specific embodiment of the invention, the feedback resistance for both op amps remain equal, i.e., track together. Note that some connectivity is established via labels, e.g., INM1 and INM2 "jump" between points in the figures.

The circuit is operated as shown in Table 1.

TABLE 1

| en_P Positive input control | en_M Negative input control | INP Positive input | INM Negative input | Function/ comments | Noise cancellation |
|---|---|---|---|---|---|
| Logic 1 | Logic 1 | positive input | negative input | pseudo-differential operation | Positive input of right op amp fed from negative input of left op amp; left op amp noise canceled |
| Logic 1 | Logic 0 | positive input | ignored | noninverting single-ended to differential conversion | Positive input of right op amp fed from negative input of left op amp; left op amp noise canceled |
| Logic 0 | Logic 1 | ignored | negative input | inverting single-ended to differential conversion | Positive input of left op amp fed from negative input of right op amp; right op amp noise canceled |
| Logic 0 | Logic 0 | ignored | ignored | disallowed condition | disallowed condition |

While the invention has been particularly shown and described with reference to specific embodiments thereof, it will be understood by those skilled in the art that changes in the form and details of the disclosed embodiments may be made without departing from the spirit or scope of the invention. For example, the various embodiments of the present invention may be implemented using discrete components, or as an integrated circuit using conventional semiconductor fabrication techniques. Moreover, an integrated circuit implementation of the present invention may employ any appropriate technology such as, for example, CMOS technology. In addition, the connections between the operational amplifiers of the present invention may be permanently hardwired, or programmable as described above with reference to FIGS. 5 and 5A–5E. Therefore, the scope of the invention should be determined with reference to the appended claims.

What is claimed is:

1. A circuit for generating a differential signal, comprising:
   a first operational amplifier with feedback, the output of the first operational amplifier corresponding to one end of the differential signal; and
   a second operational amplifier, the output of the second operational amplifier corresponding to the other end of the differential signal;
   wherein the inverting input of the first operational amplifier is coupled to the noninverting input of the second operational amplifier and the noninverting input of the first operational amplifier is coupled to ground.

2. The circuit of claim 1 wherein the first and second operational amplifiers are configured to receive a single-ended input signal and generate the differential signal.

3. The circuit of claim 2 wherein the first and second operational amplifiers are configured as an inverting circuit.

4. The circuit of claim 2 wherein the first and second operational amplifiers are configured as a noninverting circuit.

5. The circuit of claim 1 wherein the fist and second operational amplifiers are configured to receive a differential input signal and generate the differential signal.

6. The circuit of claim 1 wherein the circuit is implemented with discrete components.

7. The circuit of claim 1 wherein the circuit is an integrated circuit.

8. A circuit for generating a differential signal, comprising:
   a first operational amplifier, the output of the first operational amplifier corresponding to one end of the differential signal; and
   a second operational amplifier, the output of the second operational amplifier corresponding to the other end of the differential signal;
   a plurality of switches for configuring the first and second operational amplifiers into a plurality of configurations;
   wherein the inverting input of one of the fist and second operational amplifiers is coupled to the noninverting input of the other of the first and second operational amplifiers.

9. The circuit of claim 8 wherein the plurality of configurations includes a first configuration in which the first and second operational amplifies are configured to receive a single-ended input signal and generate the differential signal.

10. The circuit of claim 9 wherein the first and second operational amplifiers are configured as an inverting circuit in the first configuration.

11. The circuit of claim 9 wherein the first and second operational amplifiers are configured as a noninverting circuit in the first configuration.

12. The circuit of claim 8 wherein the plurality of configurations includes a first configuration in which the first and second operational amplifiers are configured to receive a differential input signal and generate the differential signal.

13. The circuit of claim 8 wherein the plurality of switches are controlled by switch control logic circuitry coupled to first and second logic inputs.

14. The circuit of claim 13 wherein the switch the switch control logic circuitry corresponds to a truth table, the truth table being as follows:

| first logic input | second logic input | op amp connections |
|---|---|---|
| 1 | 1 | the noninvertig input of the second operational amplifier is coupled to the inverting input of the first operationial amplifier, the first and second operational amplifiers are configured to receive a differential input signal and generate the differential signal |
| 1 | 0 | the noninverting input of the second operational amplifier is coupled to the inverting input of the first operational amplifier; the first snd second operational amplifiers are configured to receive a single-ended signal and generate a non-inverted differential version thereof |
| 0 | 1 | the noninverting input of the first operational amplifier is coupled to the inverting input of the second operational amplifier, the first and second operational amplifiers are configured to receive a single-ended signal and generate an inverted differential version thereof |
| 0 | 0 | disallowed condition. |

15. A circuit for generating a differential output signal, comprising:
   a first operational amplifier having an output corresponding to one end of the differential output signal;
   a second operational amplifier having an output corresponding to the other end of the differential output signal; and
   a plurality of switches coupled to the first and second operational amplifiers;
   wherein in a first mode the plurality of switches configure the first and second operational amplifiers to receive a single-ended input signal and generate the differential output signal, and in a second mode, the plurality of switches configure the first and second operational amplifiers to receive a differential input signal and generate the differential output signal, and wherein in each of the first and second modes the inverting input of one of the first and second operational amplifiers is coupled to the noninverting input of the other of the first and second operational amplifiers.

16. An electronic device comprising a circuit for generating a differential signal, the circuit comprising:
   a first operational amplifier with feedback, the output of the fist operational amplifier corresponding to one end of the differential signal; and
   a second operational amplifier, the output of the second operational amplifier corresponding to the other end of the differential signal;
   wherein the inverting input of the first operational amplifier is coupled to the noninverting input of the second operational amplifier and the noninverting input of the first operational amplifier is not coupled to the inverting input of the second operational amplifier.

17. A circuit for generating a differential signal, comprising:
   a first operational amplifier with feedback having a signal input and a bias input, the output of the first operational amplifier corresponding to one end of the differential signal; and
   a second operational amplifier having a signal input and a bias input, the output of the second operational amplifier corresponding to the other end of the differential signal;
   a plurality of switches for configuring the first and second operational amplifiers into a plurality of configurations;
   wherein the signal input of the first operational amplifier is coupled to the bias input of the second operational amplifier.

* * * * *